(12) United States Patent
Shin et al.

(10) Patent No.: US 11,056,587 B2
(45) Date of Patent: Jul. 6, 2021

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Hui Chul Shin, Suwon-si (KR); Woo Yeol Maeng, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/696,242

(22) Filed: Nov. 26, 2019

(65) Prior Publication Data

US 2020/0335623 A1 Oct. 22, 2020

(30) Foreign Application Priority Data

Apr. 16, 2019 (KR) ........................ 10-2019-0044091

(51) Int. Cl.
*H01L 29/78* (2006.01)
*H01L 29/66* (2006.01)
*H01L 29/40* (2006.01)

(52) U.S. Cl.
CPC ........ *H01L 29/7816* (2013.01); *H01L 29/402* (2013.01); *H01L 29/66681* (2013.01)

(58) Field of Classification Search
CPC ... H01L 29/402; H01L 29/404; H01L 29/405; H01L 29/407; H01L 29/7816; H01L 29/66681
See application file for complete search history.

(56) References Cited

U.S. PATENT DOCUMENTS

| | | | |
|---|---|---|---|
| 7,956,412 B2 | 6/2011 | Feilchenfeld et al. |
| 8,183,632 B2 | 5/2012 | Cho |
| 8,334,567 B2 | 12/2012 | Chu et al. |
| 8,637,929 B2 | 1/2014 | Satoh et al. |
| 9,136,350 B2 | 9/2015 | Zhou et al. |
| 9,362,388 B1 | 6/2016 | Zuniga et al. |
| 9,755,067 B2 | 9/2017 | Lim et al. |
| 9,793,394 B1 | 10/2017 | Zhu et al. |
| 10,056,481 B2 | 8/2018 | Schippel et al. |

(Continued)

FOREIGN PATENT DOCUMENTS

| KR | 10-0345305 | 7/2002 |
|---|---|---|
| KR | 10-2010-0020688 | 2/2010 |

*Primary Examiner* — Mohammed R Alam
(74) *Attorney, Agent, or Firm* — F. Chau & Associates, LLC

(57) ABSTRACT

A semiconductor device includes an active region defined by an element isolation region in a base substrate, source and drain regions of a first conductivity type spaced apart from each other, and formed in the active region, a body region of a second conductivity type surrounding the source region, and formed in the base substrate, a drift region of the first conductivity type surrounding the drain region, having a lower impurity concentration than the drain region, and formed in the base substrate, an insulating structure including a buried insulating pattern and a semiconductor pattern sequentially stacked on the drift region, a gate dielectric film including a first portion extending along an upper surface of the body region and a second portion extending along a side surface and an upper surface of the insulating structure, and a gate electrode extending along an upper surface of the gate dielectric film.

18 Claims, 18 Drawing Sheets

(56) References Cited

U.S. PATENT DOCUMENTS

| | | |
|---|---|---|
| 10,115,821 B2 | 10/2018 | Ponoth et al. |
| 10,134,641 B2 | 11/2018 | Xu |
| 2012/0161230 A1* | 6/2012 | Satoh ................ H01L 29/66545 257/335 |
| 2013/0292763 A1 | 11/2013 | Chang et al. |
| 2017/0040422 A1* | 2/2017 | Jung ................... H01L 29/7816 |
| 2017/0179280 A1* | 6/2017 | Yadav ................. H01L 29/0865 |
| 2017/0263766 A1 | 9/2017 | Xia et al. |
| 2017/0278963 A1* | 9/2017 | Liu .................... H01L 21/76897 |
| 2018/0366579 A1 | 12/2018 | Yan et al. |

* cited by examiner

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2019-0044091, filed on Apr. 16, 2019 in the Korean Intellectual Property Office, the disclosure of which is incorporated by reference herein in its entirety.

TECHNICAL FIELD

Exemplary embodiments of the present inventive concept relate to a semiconductor device and a method for fabricating the same, and more specifically, to a semiconductor device including a high-voltage transistor and a method for fabricating the same.

DISCUSSION OF RELATED ART

A power metal-oxide-semiconductor (MOS) transistor (e.g., a MOS Field Effect Transistor (MOSFET)) has a larger power gain than that of a bipolar transistor, has a simple gate drive circuit, and has no time delay or the like due to accumulation or recombination of minority carriers generated during a turn-off operation. Thus, power MOS transistors are widely used as switches for control, logic, and power.

Examples of power MOS transistors include lateral double-diffused MOSFET (LDMOS) or drain-extended MOSFET (DeMOS).

SUMMARY

According to an exemplary embodiment of the present inventive concept, a semiconductor device includes an active region defined by an element isolation region in a base substrate, a source region and a drain region of a first conductivity type spaced apart from each other, and formed in the active region, a body region of a second conductivity type surrounding the source region, and formed in the base substrate, a drift region of the first conductivity type surrounding the drain region, having a lower impurity concentration than the drain region, and formed in the base substrate, an insulating structure including a buried insulating pattern and a semiconductor pattern sequentially stacked on the drift region, a gate dielectric film including a first portion extending along an upper surface of the body region and a second portion extending along a side surface and an upper surface of the insulating structure, and a gate electrode extending along an upper surface of the gate dielectric film.

According to an exemplary embodiment of the present inventive concept, a semiconductor device includes a base substrate, a gate structure formed on the base substrate, and including a gate electrode and a gate dielectric film between the base substrate and the gate electrode, a source region of a first conductivity type disposed on a first side of the gate structure, a body region of a second conductivity type surrounding the source region, and formed in the base substrate, a drain region of the first conductivity type disposed on a second side of the gate structure, a drift region of the first conductivity type surrounding the drain region, having an impurity concentration lower than the drain region, and formed in the base substrate, and an insulating structure interposed between the second side of the gate structure and the drift region. A lowermost surface of the insulating structure is disposed on the same plane as an uppermost surface of the drift region.

According to an exemplary embodiment of the present inventive concept, a semiconductor device includes a base substrate, a source region and a drain region of a first conductivity type spaced apart from each other, and formed in the base substrate, a body region of a second conductivity type surrounding the source region, and formed in the base substrate, a drift region of the first conductivity type surrounding the drain region, having a lower impurity concentration than the drain region, and formed in the base substrate, an insulating structure disposed on the drift region, a gate structure disposed over the body region and the insulating structure, and formed on the base substrate between the source region and the drain region, and a dummy gate structure extending along an upper surface of the drift region, and formed on the drift region between the insulating structure and the drain region.

BRIEF DESCRIPTION OF THE DRAWINGS

The above and other aspects and features of the present inventive concept will become more apparent by describing in detail exemplary embodiments thereof with reference to the attached drawings.

DETAILED DESCRIPTION OF THE EMBODIMENTS

Figure 1:
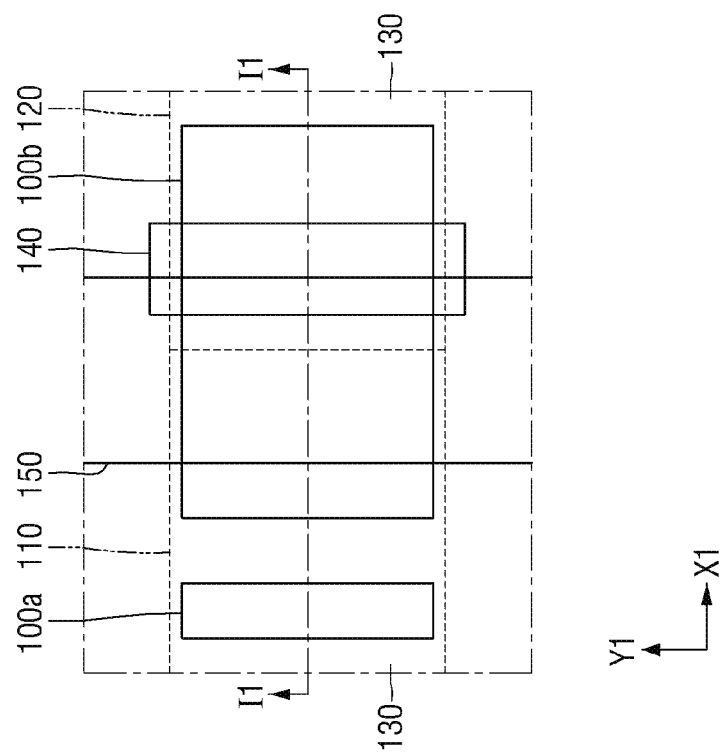
FIG. 1 is a schematic layout view for explaining a semiconductor device according to exemplary embodiments of the present inventive concept.

Exemplary embodiments of the present inventive concept provide a semiconductor device with improved reliability and radio frequency (RF) characteristics.

Exemplary embodiments of the present inventive concept also provide a method for fabricating the semiconductor device with improved reliability and RF characteristics.

Exemplary embodiments of the present inventive concept will be described more fully hereinafter with reference to the accompanying drawings. Like reference numerals may refer to like elements throughout this application.

Hereinafter, a semiconductor device according to exemplary embodiments of the present inventive concept will be described with reference to FIGS. 1 to 13.

Figure 2:
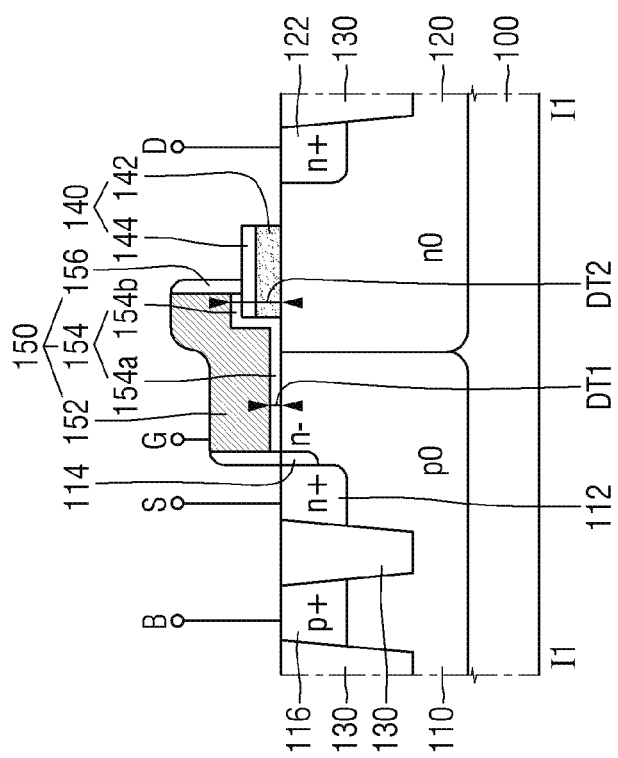
FIG. 2 is a cross-sectional view taken along a line I1-I1 of FIG. 1 according to exemplary embodiments of the present inventive concept.

FIG. 1 is a schematic layout view for explaining a semiconductor device according to exemplary embodiments of the present inventive concept. FIG. 2 is a cross-sectional view taken along a line I1-I1 of FIG. 1 according to exemplary embodiments of the present inventive concept.

The semiconductor device according to exemplary embodiments of the present inventive concept may be a lateral double-diffused MOSFET (LDMOS), but this is merely an example. For convenience of explanation, the semiconductor device according to exemplary embodiments of the present inventive concept will be described as being an n-type transistor. However, the present inventive concept is not limited thereto, and the present inventive concept can also be applied to transistors of other forms and other conductivity types.

Referring to FIGS. 1 and 2, the semiconductor device according to exemplary embodiments of the present inventive concept includes a base substrate 100, a first element isolation region 130, a first body region 110, a first source region 112, a first drift region 120, a first drain region 122, a first insulating structure 140, and a first gate structure 150.

The base substrate 100 may include, but is not limited to, a substrate and an epitaxial layer grown on the substrate. Alternatively, the base substrate 100 may not include an epitaxial layer. The base substrate 100 may also be a silicon substrate, a gallium arsenide substrate, a silicon germanium substrate, a ceramic substrate, a quartz substrate, a glass substrate for display, or the like. For convenience of description, the base substrate 100 will be described as being a silicon substrate as an example.

In exemplary embodiments of the present inventive concept, the base substrate 100 may be doped with an impurity. For example, when the semiconductor device according to exemplary embodiments of the present inventive concept is a transistor of a first conductivity type (e.g., an n-type), the base substrate 100 may doped with an impurity of a second conductivity type (e.g., a p-type).

The base substrate 100 may include a first active region 100a and a second active region 100b. The first active region 100a and the second active region 100b may be isolated by the first element isolation region 130 formed in the base substrate 100. In other words, the first active region 100a and the second active region 100b may be defined by the first element isolation region 130. As illustrated in FIG. 1, for example, the first active region 100a and the second active region 100b may be spaced apart from each other in a first direction X1 with the first element isolation region 130 interposed therebetween.

The first element isolation region 130 may be, for example, an oxide film formed by a Shallow Trench Isolation (STI) process or a LOCal Oxidation of Silicon (LOCOS) process, but is not limited thereto.

The first source region 112 and the first drain region 122 may be formed in the base substrate 100 to be spaced apart from each other. For example, the first source region 112 and the first drain region 122 may be formed in the second active region 100b to be spaced apart from each other in the first direction X1.

The first source region 112 and the first drain region 122 may be doped with impurities of the same conductivity type as each other. When the semiconductor device according to exemplary embodiments of the present inventive concept is a transistor of the first conductivity type (e.g., the n-type), the first source region 112 and the first drain region 122 may be doped with the first conductivity type (e.g., the n-type).

The first source region 112 may be connected to a source line S. Therefore, a source voltage may be applied to the first source region 112. The source line S may apply a ground voltage to, for example, the first source region 112, but is not limited thereto.

The first drain region 122 may be connected to a drain line D. Therefore, a drain voltage may be applied to the first drain region 122. The drain line D may apply a high voltage to the first drain region 122. For example, the drain line D may apply a high voltage of about 5 V to the first drain region 122, but is not limited thereto.

The first body region 110 may be formed in the base substrate 100 below the first source region 112. Additionally, the first body region 110 may be formed to surround the first source region 112. In other words, the first source region 112 may be formed in the first body region 110. As illustrated in FIG. 1, the first body region 110 may be formed, for example, over a part of the second active region 100b and the first active region 100a.

When the semiconductor device according to exemplary embodiments of the present inventive concept is a transistor of the first conductivity type (e.g., the n-type), the first body region 110 may be doped with the second conductivity type (e.g., the p-type). In exemplary embodiments of the present inventive concept, the impurity concentration of the first body region 110 may be higher than the impurity concentration of the base substrate 100.

In exemplary embodiments of the present inventive concept, a first body contact region 116 may be further formed in the first body region 110. The first body contact region 116 may be formed, for example, in the first active region 100a.

The first body contact region 116 may be doped with an impurity of the same conductivity type as that of the first body region 110. For example, if the semiconductor device according to exemplary embodiments of the present inventive concept is a transistor of the first conductivity type (e.g., the n-type), the first body contact region 116 may be doped with the second conductivity type (e.g., the p-type). In exemplary embodiments of the present inventive concept, the impurity concentration of the first body contact region 116 may be higher than the impurity concentration of the first body region 110.

The first body contact region 116 may be connected to a body line B. Therefore, a body voltage may be applied to the first body contact region 116. The body line B may apply a ground voltage, for example, to the first body contact region 116, but is not limited thereto.

Although the first body contact region 116 is illustrated as being spaced apart from the first source region 112 by the first element isolation region 130, this is merely an example. For example, the first source region 112 and the first body contact region 116 may be in contact with each other in the first body region 110.

In exemplary embodiments of the present inventive concept, a first source expansion region 114 may be further formed in the first body region 110. The first source expansion region 114 may be formed, for example, in the second active region 100b. The first source expansion region 114 may be formed to be in contact with the first source region 112, between the first source region 112 and the first drain region 122.

The first source expansion region 114 may be doped with an impurity of the same conductivity type as that of the first source region 112. For example, if the semiconductor device according to exemplary embodiments of the present inventive concept is a transistor of the first conductivity type (e.g., n-type), the first source expansion region 114 may be doped with the first conductivity type (e.g., the n-type). In exemplary embodiments of the present inventive concept, the impurity concentration of the first source expansion region 114 may be lower than the impurity concentration of the first source region 112.

The first drift region 120 may be formed in the base substrate 100 below the first drain region 122. Additionally, the first drift region 120 may be formed to surround the first drain region 122. In other words, the first drain region 122 may be formed in the first drift region 120. As illustrated in FIG. 1, the first drain region 122 may be formed in the first drift region 120, for example, over another part of the second active region 100b.

The first drift region 120 may be doped with the impurity of the same conductivity type as that of the first drain region 122. For example, if the semiconductor device according to exemplary embodiments of the present inventive concept is a transistor of the first conductivity type (e.g., the n-type), the first drift region 120 may be doped with the first conductivity type (e.g., the n-type). Additionally, the impurity concentration of the first drift region 120 may be lower than the impurity concentration of the first source region 112 and the impurity concentration of the first drain region 122.

Although the upper part of the first body region 110 and the upper part of the first drift region 120 are illustrated as being in contact with each other, the present inventive concept is not limited thereto. For example, the first body region 110 and the first drift region 120 may be formed to be spaced apart from each other. Alternatively, for example, the first drift region 120 may be formed to surround the first body region 110.

A depth at which the first body region 110 is formed, and a depth at which the first drift region 120 is formed are illustrated as being the same as each other, but the present inventive concept is limited thereto. In exemplary embodiments of the present inventive concept, the depth at which the first drift region 120 is formed may be deeper than the depth at which the first body region 110 is formed.

In exemplary embodiments of the present inventive concept, the first element isolation region 130 is only formed to define an active region (e.g., the first active region 100a and the second active region 100b) in the base substrate 100, but is not formed to prevent a decrease in breakdown voltage of the drift region (e.g., the first drift region 120) of the semiconductor device. In other words, in exemplary embodiments of the present inventive concept, the first element isolation region 130 may not be disposed in the first drift region 120 between the first source region 112 and the first drain region 122.

The first insulating structure 140 may be formed on the first drift region 120 between the first source region 112 and the first drain region 122. Additionally, the first insulating structure 140 may extend along the upper surface of the first drift region 120.

In exemplary embodiments of the present inventive concept, the first insulating structure 140 may include a first buried insulating pattern 142 and a first semiconductor pattern 144 sequentially stacked on the first drift region 120. The first buried insulating pattern 142 may cover at least a part of the upper surface of the first drift region 120. The first semiconductor pattern 144 may cover the upper surface of the first buried insulating pattern 142.

In exemplary embodiments of the present inventive concept, the first semiconductor pattern 144 may cover the entire upper surface of the first buried insulating pattern 142. In exemplary embodiments of the present inventive concept, the first semiconductor pattern 144 may be omitted.

The first buried insulating pattern 142 may include, but is not limited to, for example, at least one of silicon oxide, silicon oxynitride, silicon nitride, or a combination thereof. For the convenience of description, the first buried insulating pattern 142 will be described as being silicon oxide, as an example.

The first semiconductor pattern 144 may include, for example, silicon (Si) or germanium (Ge), which is an elemental semiconductor material. Further, the first semiconductor pattern 144 may also include a compound semiconductor, for example, a group IV-IV compound semiconductor or a group III-V compound semiconductor.

Taking a case where the first semiconductor pattern 144 includes a group IV-IV compound semiconductor as an example, the first semiconductor pattern 144 may include a binary compound or a ternary compound containing at least two or more of carbon (C), silicon (Si), germanium (Ge), and tin (Sn), or a compound obtained by doping these elements with a group IV element thereof. Taking a case where the first semiconductor pattern 144 includes a group III-V compound semiconductor as an example, the first semiconductor pattern 144 may include one of a binary compound, a ternary compound, or a quaternary compound formed by combining at least one of aluminum (Al), gallium (Ga), and indium (In) as a group III element with one of phosphorus (P), arsenic (As), and antimony (Sb) as a group V element.

In exemplary embodiments of the present inventive concept, the first insulating structure 140 may not be buried in the first drift region 120. For example, the lowermost surface of the first insulating structure 140 may be disposed on the same plane as the uppermost surface of the first drift region 120.

The first gate structure 150 may be formed on the base substrate 100 between the first source region 112 and the first drain region 122. For example, the first source region 112 may be disposed on one side of the first gate structure 150, and the first drain region 122 may be disposed on the other side of the first gate structure 150. The first gate structure 150 may include a first gate electrode 152, a first gate dielectric film 154, and a first gate spacer 156. For example, the first gate electrode 152 may extend in a second direction Y1 intersecting the first direction X1.

In exemplary embodiments of the present inventive concept, the first gate electrode 152 may be formed over the first body region 110 and the first drift region 120. For example, a part of the first gate electrode 152 may overlap the first body region 110 and another part of the first gate electrode 152 may overlap the first drift region 120. As used herein, the term "overlap" means overlapping in a direction perpendicular to the upper surface of the base substrate 100.

The first gate electrode 152 may include a conductive material. For example, the first gate electrode 152 may include at least one of polysilicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al), tungsten (W), or a combination thereof. Hereinafter, for example, the first gate electrode 152 will be described as including polysilicon.

The first gate electrode 152 may be connected to a gate line G. Thus, a gate voltage may be applied to the first gate electrode 152. The semiconductor device according to exemplary embodiments of the present inventive concept may be a high-voltage transistor. For example, the gate line G may apply a high voltage of about 5 V to about 100 V to the first gate electrode 152, but is not limited thereto.

The first gate dielectric film 154 may be interposed between the base substrate 100 and the first gate electrode 152. For example, the first gate dielectric film 154 may be formed over the first body region 110 and the first drift region 120. Although the first gate dielectric film 154 is illustrated as extending along only the bottom surface of the first gate electrode 152, this is merely an example. For example, the first gate dielectric film 154 may further extend along the side surface of the first gate electrode 152.

The first gate dielectric film 154 may include, for example, a high dielectric material having a dielectric constant higher than silicon oxide, silicon oxynitride, silicon nitride, and silicon oxide. The high dielectric material may include, but is not limited to, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The first gate spacer 156 may be formed on both side surfaces of the first gate electrode 152. For example, the first gate dielectric film 154 and the first gate electrode 152 may be formed to fill a trench formed by the inner side walls of the first gate spacer 156.

The first gate spacer 156 may include, but is not limited to, for example, at least one of silicon nitride (SiN), silicon oxynitride (SiON), silicon oxide (SiO2), silicon oxycarbonitride (SiOCN), or a combination thereof.

A part of the first gate structure 150 adjacent to the first drain region 122 may overlap the first insulating structure 140. For example, one side of the first gate structure 150 adjacent to the first source region 112 may be disposed on the first body region 110, and the other side of the first gate structure 150 adjacent to the first drain region 122 may be disposed on the first insulating structure 140. In other words, the first insulating structure 140 may be interposed between the other side of the first gate structure 150 and the first drift region 120.

For example, the first gate dielectric film 154 may include a first portion 154a extending along the upper surface of the first body region 110 between the first source region 112 and the first insulating structure 140, and a second portion 154b extending from the first portion 154a and extending along the side surfaces and the upper surface of the first insulating structure 140.

In exemplary embodiments of the present inventive concept, the first portion 154a of the first gate dielectric film 154 may further extend along the upper surface of the first drift region 120 between the first source region 112 and the first insulating structure 140. For example, as illustrated in FIG. 2, the first portion 154a of the first gate dielectric film 154 may extend along the upper surface of the first body region 110 and the upper surface of the first drift region 120, between the first source region 112 and the first insulating structure 140.

Although the second portion 154b of the first gate dielectric film 154 is illustrated as covering only a part of the upper surface of the first insulating structure 140, this is merely an example. For example, unlike the illustrated configuration, the second portion 154b of the first gate dielectric film 154 may also cover the entire upper surface of the first insulating structure 140.

The first gate electrode 152 may extend along the upper surface of the first gate dielectric film 154. Therefore, a distance DT2 between the first gate electrode 152 on the first insulating structure 140 and the first drift region 120 may be greater than the thickness DT1 of the first gate dielectric film 154.

In exemplary embodiments of the present inventive concept, as illustrated in FIG. 2, the upper surface of the first gate electrode 152 may have a step. For example, the height of the upper surface of the first gate electrode 152 on the first insulating structure 140 may be higher than the height of the upper surface of the first gate electrode 152 on the first body region 110. However, the present inventive concept is not limited thereto, and the upper surface of the first gate electrode 152 may not have a step. For example, the height of the upper surface of the first gate electrode 152 on the first body region 110 may be substantially the same as the height of the upper surface of the first gate electrode 152 on the first insulating structure 140, by a planarization process.

With the gradual high integration of semiconductor devices, when a high voltage is applied to the drain region of a semiconductor device, the breakdown voltage of the semiconductor device may be lowered due to a high electric field formed between an edge of a gate electrode and the drain region. To prevent this problem, a method for forming an element isolation region below the edge of the gate electrode adjacent to the drain region may be used. However, a current may concentrate in such an element isolation region at the time of operation of the semiconductor device, which deteriorates the RF characteristics of the semiconductor device.

However, the semiconductor device according to exemplary embodiments of the present inventive concept may prevent the breakdown voltage drop of the semiconductor device and improve reliability, even without forming the element isolation region below the edge of the gate electrode adjacent to the drain region. For example, as described above, the first insulating structure 140 may be interposed between the other side of the first gate electrode 152 adjacent to the first drain region 122 and the first drift region 120. The first insulating structure 140 may prevent the breakdown voltage of the semiconductor device from being lowered due to the high electric field formed between the edge of the first gate electrode 152 and the first drain region 122. Thus, a semiconductor device with improved reliability can be provided.

Additionally, in the semiconductor device according to exemplary embodiments of the present inventive concept, the first element isolation region 130 is not disposed in the first drift region 120 between the first source region 112 and the first drain region 122. Thus, it is possible to prevent current from being concentrated in an element isolation region between the first source region 112 and the first drain region 122 at the time of operation of the semiconductor device. Thus, a semiconductor device with improved RF characteristics can be provided.

Figure 3:
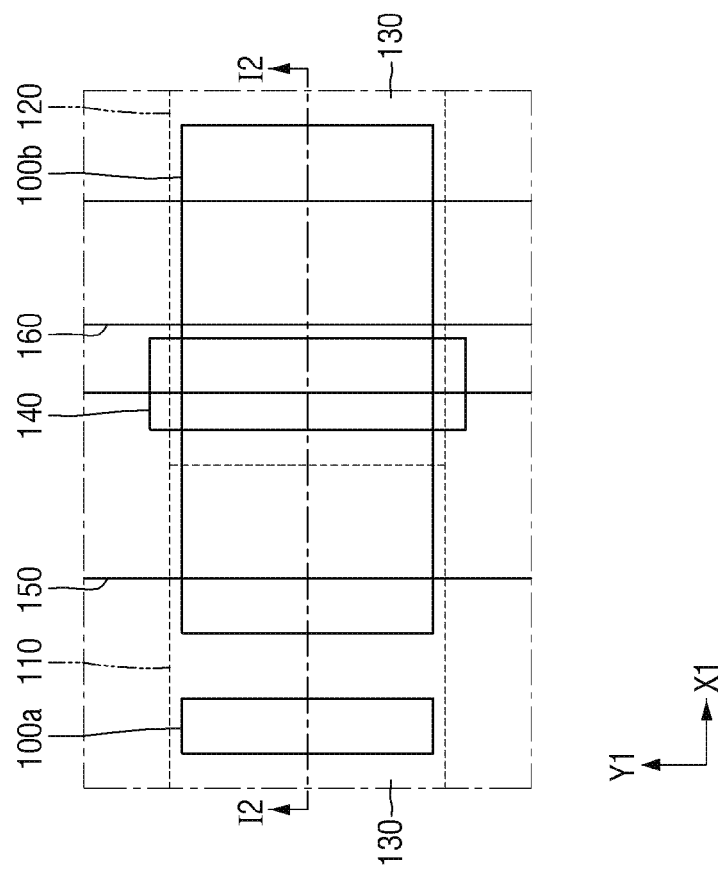
FIG. 3 is a schematic layout view for explaining a semiconductor device according to exemplary embodiments of the present inventive concept.
Figure 4:
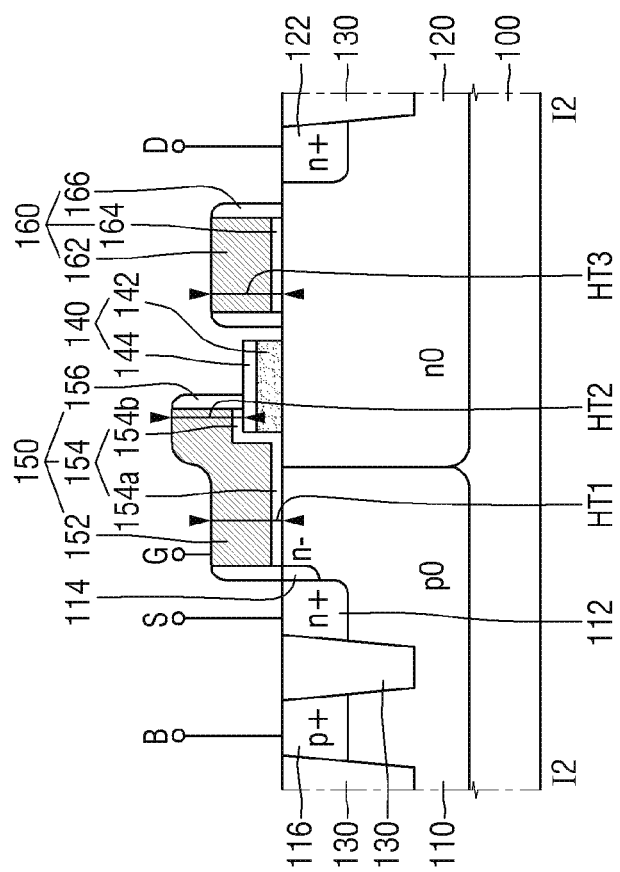
FIG. 4 is a cross-sectional view taken along a line I2-I2 of FIG. 3 according to exemplary embodiments of the present inventive concept.

FIG. 3 is a schematic layout view for explaining a semiconductor device according to exemplary embodiments of the present inventive concept. FIG. 4 is a cross-sectional view taken along a line I2-I2 of FIG. 3 according to exemplary embodiments of the present inventive concept. For the convenience of description, elements previously described with reference to FIGS. 1 and 2 will be briefly described or descriptions thereof may be omitted.

Referring to FIGS. 3 and 4, the semiconductor device according to exemplary embodiments of the present inventive concept may further include a first dummy gate structure 160.

The first dummy gate structure 160 may be formed on the first drift region 120 between the first insulating structure 140 and the first drain region 122. Additionally, the first dummy gate structure 160 may extend along the upper surface of the first drift region 120.

The first dummy gate structure 160 is illustrated as being spaced apart from the first insulating structure 140, but this is merely an example. For example, the first dummy gate structure 160 may be in contact with the first insulating structure 140.

The first dummy gate structure 160 may include a first dummy gate electrode 162, a first dummy gate dielectric film 164, and a first dummy gate spacer 166. The first dummy gate electrode 162 may extend, for example, in the second direction Y1. In exemplary embodiments of the present inventive concept, the first dummy gate electrode 162 may be electrically floating. The first dummy gate dielectric film 164 may be interposed between the base substrate 100 and the first dummy gate electrode 162. The first dummy gate spacer 166 may be formed on both side surfaces of the first dummy gate electrode 162.

In exemplary embodiments of the present inventive concept, the first dummy gate structure 160 may be formed at the same level as the first gate structure 150. As used herein, the term "same level" refers to a level formed by the same fabricating process. For example, the first dummy gate dielectric film 164 may have the same material configuration as that of the first gate dielectric film 154, the first dummy gate electrode 162 may have the same material configuration as that of the first gate electrode 152, and the first dummy gate spacer 166 may have the same material configuration as that of the first gate spacer 156. In the present specification, the term "same" refers to not only completely the same material configuration but also fine differences that may occur due to process margins and the like.

In exemplary embodiments of the present inventive concept, as illustrated in FIG. 4, the thickness of the first dummy gate structure 160 may be substantially the same as the thickness of the first gate structure 150. For example, a height HT3 of the first dummy gate structure 160 may be the substantially same as a height HT1 of the first gate structure 150 on the first body region 110. Additionally, for example, the height HT3 of the first dummy gate structure 160 may be substantially the same as a height HT2 of the first gate structure 150 on the first insulating structure 140.

The first dummy gate structure 160 may be interposed between the first gate electrode 152 and the first drain region 122. In other words, the first gate electrode 152 may be spaced apart from the first drain region 122 by the first dummy gate structure 160. In such a case, the breakdown voltage drop of the semiconductor device due to the high electric field formed between the edge of the first gate electrode 152 and the first drain region 122 may be prevented. Thus, a semiconductor device with further improved reliability can be provided.

Figure 5:
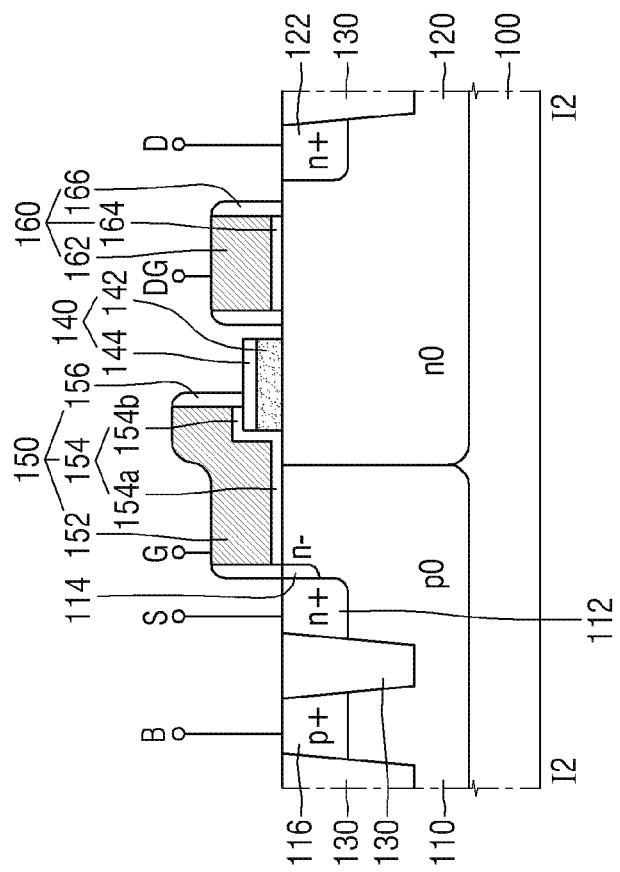
FIG. 5 is a cross-sectional view for explaining a semiconductor device according to exemplary embodiments of the present inventive concept.

FIG. 5 is a cross-sectional view for explaining a semiconductor device according to exemplary embodiments of the present inventive concept. For the convenience of description, elements previously described with reference to FIGS. 1 to 4 will be briefly described or descriptions thereof may be omitted.

Referring to FIG. 5, in the semiconductor device according to exemplary embodiments of the present inventive concept, a predetermined voltage may be applied to the first dummy gate electrode 162.

For example, the first dummy gate electrode 162 may be connected to a dummy gate line DG. The dummy gate line DG may apply a predetermined voltage to the first dummy gate electrode 162. The dummy gate line DG may apply a ground voltage, for example, to the first dummy gate electrode 162, but is not limited thereto.

Figure 6:
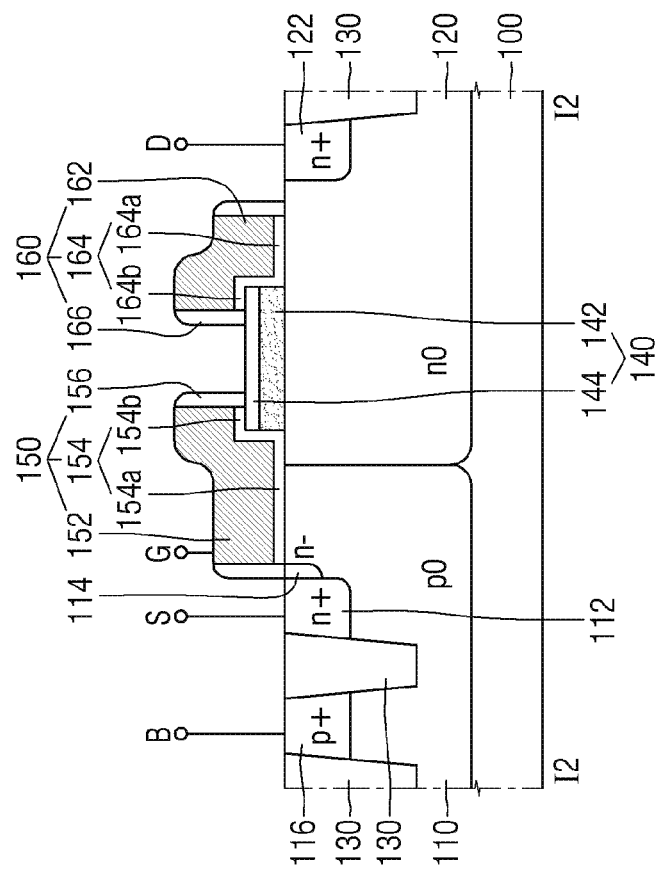
FIG. 6 is a cross-sectional view for explaining a semiconductor device according to exemplary embodiments of the present inventive concept.

FIG. 6 is a cross-sectional view for explaining a semiconductor device according to exemplary embodiments of the present inventive concept. For the convenience of description, elements previously described with reference to FIGS. 1 to 4 will be briefly described or descriptions thereof may be omitted.

Referring to FIG. 6, in the semiconductor device according to exemplary embodiments of the present inventive concept, a part of the first dummy gate structure 160 may overlap the first insulating structure 140.

For example, one side of the first dummy gate structure 160 adjacent to the first source region 112 may be disposed on the first insulating structure 140, and the other side of the first dummy gate structure 160 adjacent to the first drain region 122 may be disposed on the first drift region 120. In other words, the first insulating structure 140 may be interposed between one side of the first dummy gate structure 160 and the first drift region 120.

For example, the first dummy gate dielectric film 164 may include a third portion 164a extending along the upper surface of the first drift region 120 between the first drain region 122 and the first insulating structure 140, and a fourth portion 164b extending from the third portion 164a and extending along the side surface and the upper surface of the first insulating structure 140.

The first dummy gate structure 160 is illustrated as being spaced apart from the first gate structure 150, but this is only an example. For example, the side surface of the first dummy gate spacer 166 may be in contact with the side surface of the first gate spacer 156.

Figure 7:
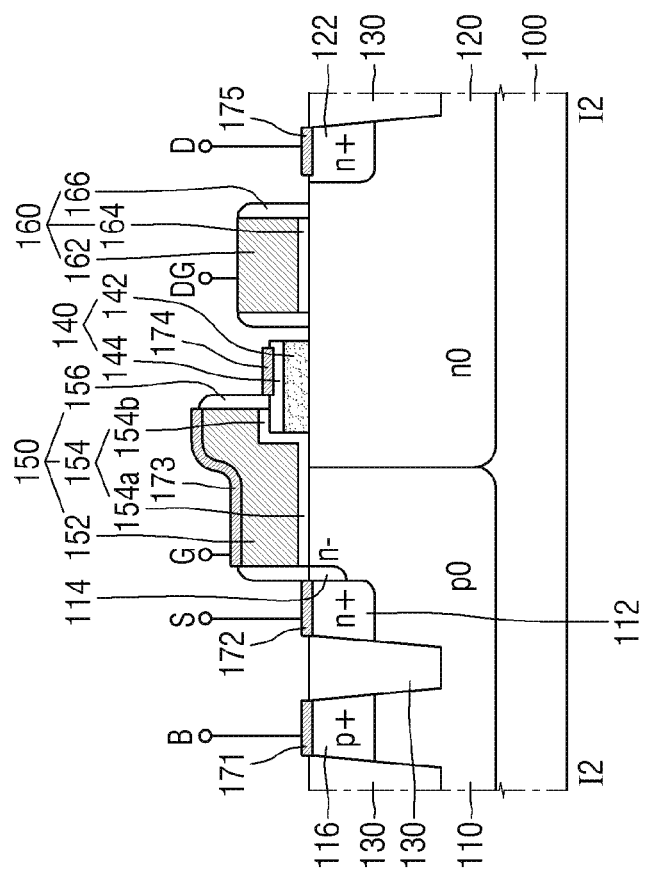
FIG. 7 is a cross-sectional view for explaining a semiconductor device according to exemplary embodiments of the present inventive concept.

FIG. 7 is a cross-sectional view for explaining a semiconductor device according to exemplary embodiments of the present inventive concept. For the convenience of description, elements previously described with reference to FIGS. 1 to 4 will be briefly described or descriptions thereof may be omitted.

Referring to FIG. 7, the semiconductor device according to exemplary embodiments of the present inventive concept further includes silicide patterns 171, 172, 173, 174, and 175.

The silicide patterns 171, 172, 173, 174 and 175 may be formed on at least some parts of the exposed portions of the first body region 110, the first body contact region 116, the first source region 112, the first gate electrode 152, the first semiconductor pattern 144, the first dummy gate electrode 162, and the first drift region 120.

For example, as illustrated, the first silicide pattern 171 may extend along the upper surface of the first body contact region 116, the second silicide pattern 172 may extend along the upper surface of the first source region 112, the third silicide pattern 173 may extend along the upper surface of the first gate electrode 152, the fourth silicide pattern 174 may extend along the upper surface of the first semiconductor pattern 144, and the fifth silicide pattern 175 may extend along the upper surface of the first drain region 122, but this is only an example.

Although the fourth silicide pattern 174 is illustrated as extending along only a part of the upper surface of the first semiconductor pattern 144, this is merely an example. For example, depending on the shape of a blocking pattern (e.g., 180 of FIG. 18) for forming a silicide pattern, the fourth silicide pattern 174 may cover both the upper surface and the side surfaces of the first semiconductor pattern 144. Similarly, although the fifth silicide pattern 175 is illustrated as extending along only a part of the upper surface of the first drain region 122, the fifth silicide pattern 175 may of course cover the entire upper surface of the first drain region 122.

Each of the silicide patterns 171, 172, 173, 174, and 175 may be connected to contacts for applying a voltage to reduce the resistance with the contacts. For example, the first silicide pattern 171 may be connected to the body line B, the second silicide pattern 172 may be connected to the silicon line S, the third silicide pattern 173 may be connected to the gate line G, and the fifth silicide pattern 175 may be connected to the drain line D.

The silicide patterns 171, 172, 173, 174, and 175 may include a metal silicide. For example, the silicide patterns 171, 172, 173, 174, and 175 may include, but are not limited to, at least one of titanium silicide, tantalum silicide, tungsten silicide, nickel silicide, cobalt silicide, or combinations thereof.

Figure 8:
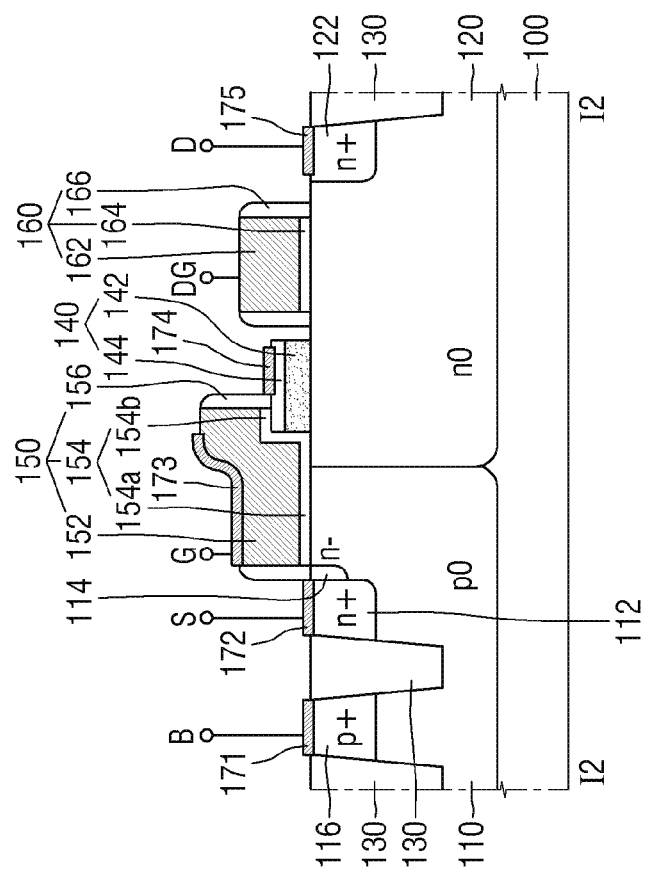
FIG. 8 is a cross-sectional view for explaining a semiconductor device according to exemplary embodiments of the present inventive concept.

FIG. 8 is a cross-sectional view for explaining a semiconductor device according to exemplary embodiments of the present inventive concept. For the convenience of description, elements previously described with reference to FIGS. 1 to 4 and 7 will be briefly described or descriptions thereof may be omitted.

Referring to FIG. 8, in the semiconductor device according to exemplary embodiments of the present inventive concept, the third silicide pattern 173 exposes a part of the first gate electrode 152.

In exemplary embodiments of the present inventive concept, the third silicide pattern 173 may expose at least a part of the first gate electrode 152 that overlaps the first drift region 120. For example, as illustrated, the third silicide pattern 173 may extend along the upper surface of the first gate electrode 152 that overlaps the first body region 110, and may expose a part of the upper surface of the first gate electrode 152 that overlaps the first insulating structure 140.

In such a case, the electric field formed by the third silicide pattern 173 may be reduced by the voltage applied from the gate line G. In other words, the third silicide pattern 173 may more effectively prevent the breakdown voltage of the semiconductor device from being lowered due to the high electric field formed between the edge of the first gate electrode 152 and the first drain region 122. Thus, a semiconductor device with further improved reliability can be provided.

Although the third silicide pattern 173 is illustrated as completely covering the upper surface of the first gate electrode 152 that overlaps the first body region 110, this is merely an example. In exemplary embodiments of the present inventive concept, unlike the illustrated configuration, the third silicide pattern 173 may expose a part of the upper surface of the first gate electrode 152 that overlaps the first body region 110, as well as the upper surface of the first gate electrode 152 that overlaps the first drift region 120.

Figure 9:
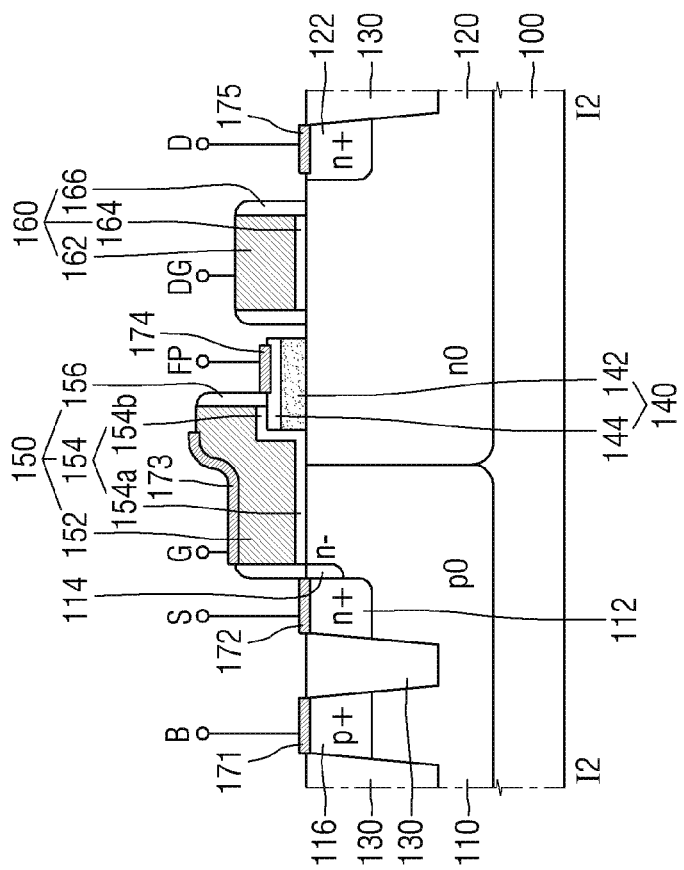
FIG. 9 is a cross-sectional view for explaining a semiconductor device according to exemplary embodiments of the present inventive concept.

FIG. 9 is a cross-sectional view for explaining a semiconductor device according to exemplary embodiments of the present inventive concept. For the convenience of description, elements previously described with reference to FIGS. 1 to 4, 7 and 8 will be briefly described or descriptions thereof may be omitted.

Referring to FIG. 9, in the semiconductor device according to exemplary embodiments of the present inventive concept, a predetermined voltage may be applied to the first semiconductor pattern 144.

For example, the fourth silicide pattern 174 extending along the upper surface of the first semiconductor pattern 144 may be connected to a field plate line FP. The field plate line FP may apply a predetermined voltage to the fourth silicide pattern 174. For example, the field plate line FP may apply a ground voltage, but is not limited to, to the fourth silicide pattern 174.

The fourth silicide pattern 174 may function as a field plate that relieves an electric field concentration around the first insulating structure 140. Thus, a semiconductor device with further improved reliability can be provided.

Figure 10:
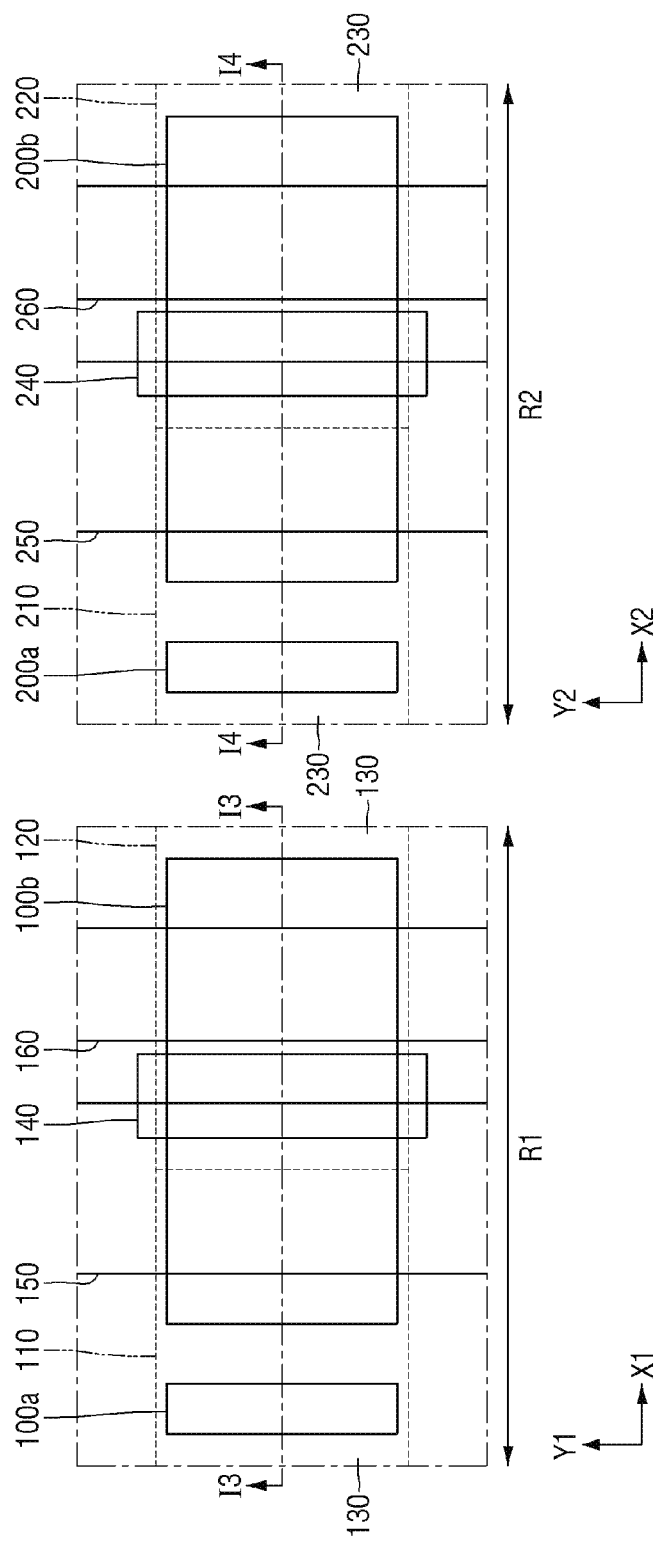
FIG. 10 is a schematic layout view for explaining a semiconductor device according to exemplary embodiments of the present inventive concept.
Figure 11:
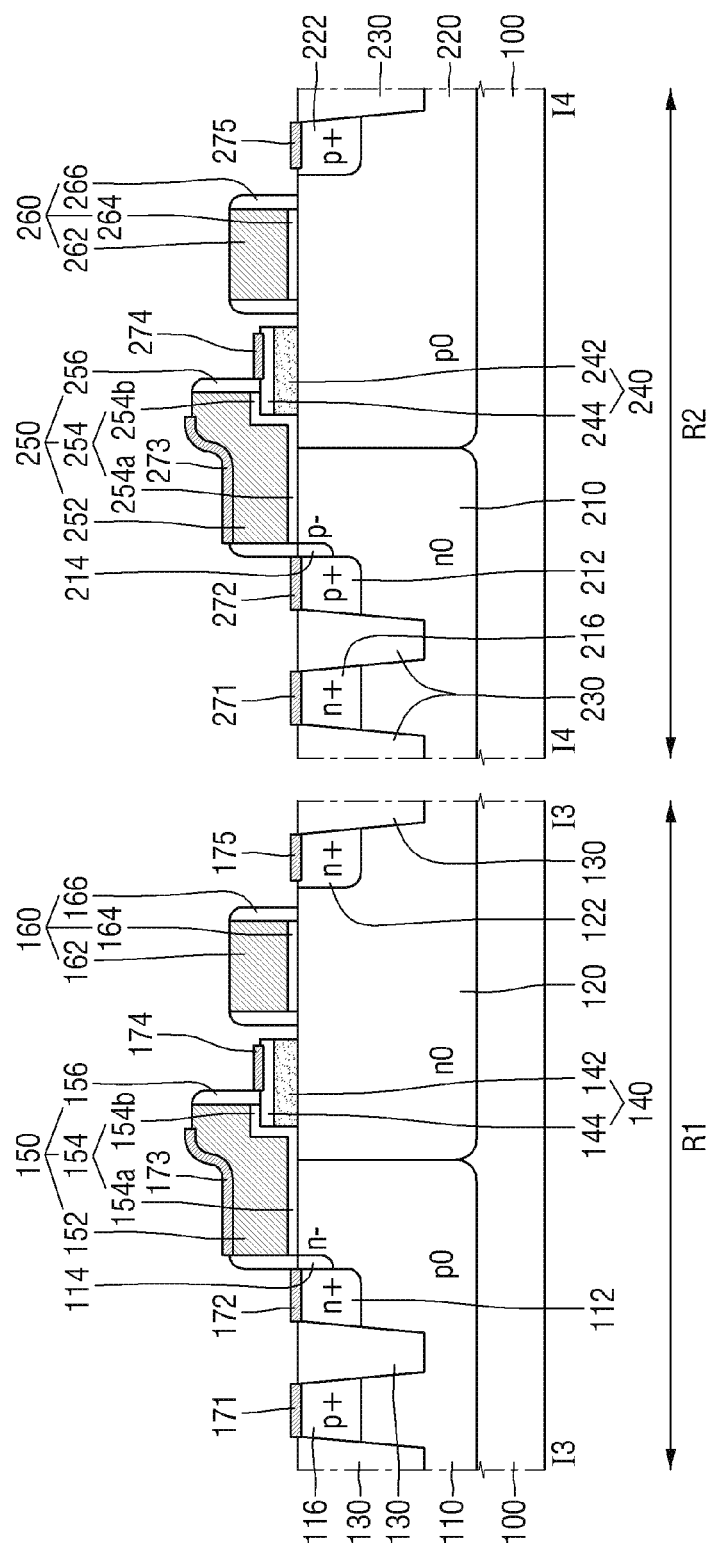
FIG. 11 is a cross-sectional view taken along lines I3-I3 and I4-I4 of FIG. 10 according to exemplary embodiments of the present inventive concept.

FIG. 10 is a schematic layout view for explaining a semiconductor device according to exemplary embodiments of the present inventive concept. FIG. 11 is a cross-sectional view taken along lines I3-I3 and I4-I4 of FIG. 10 according to exemplary embodiments of the present inventive concept. For the convenience of description, elements previously described with reference to FIGS. 1 to 9 will be briefly described or descriptions thereof may be omitted.

Referring to FIGS. 10 and 11, the semiconductor device according to exemplary embodiments of the present inventive concept further includes a second element isolation region 230, a second body region 210, a second source region 212, a second drift region 220, a second drain region 222, a second insulating structure 240, and a second gate structure 250.

The base substrate 100 may include a first region R1 and a second region R2. The first region R1 and the second region R2 may be regions spaced apart from each other and may be regions connected to each other.

Hereinafter, it is assumed that an n-type transistor is formed in the first region R1 and a p-type transistor is formed in the second region R2. However, instead, a p-type transistor may be formed in the first region R1 and an n-type transistor may be formed in the second region R2. For reference, since the element formed in the first region R1 is substantially the same as the semiconductor device described using FIGS. 1 to 9, a detailed description thereof will not be provided below.

The second element isolation region 230, the second body region 210, the second source region 212, the second drift region 220, the second drain region 222, the second insulating structure 240, and the second gate structure 250 may be disposed on the second region R2 of the base substrate 100.

The base substrate 100 may further include a third active region 200a and a fourth active region 200b disposed in the second region R2. The third active region 200a and the fourth active region 200b may be isolated by the second element isolation region 230 formed in the base substrate 100.

The second source region 212 and the second drain region 222 may be formed in the base substrate 100 to be spaced apart from each other. For example, the second source region 212 and the second drain region 222 may be formed in the fourth active region 200b to be spaced apart from each other in a third direction X2. The first direction X1 and the third direction X2 may be the same direction as each other or may be different directions from each other. The second source region 212 and the second drain region 222 may be doped with the second conductivity type (e.g., the p-type).

The second body region 210 may be formed in the base substrate 100 below the second source region 212. Additionally, the second body region 210 may be formed to surround the second source region 212. The second body region 210 may be doped with the first conductivity type (e.g., the n-type).

In exemplary embodiments of the present inventive concept, a second body contact region 216 may be further formed in the second body region 210. The second body contact region 216 may be formed, for example, in the third active region 200a. The second body contact region 216 may be doped with the first conductivity type (e.g., the n-type). In exemplary embodiments of the present inventive concept, the impurity concentration of the second body contact region 216 may be higher than the impurity concentration of the second body region 210.

In exemplary embodiments of the present inventive concept, a second source expansion region 214 may be further formed in the second body region 210. The second source expansion region 214 may be formed, for example, in the fourth active region 200b. The second source expansion region 214 may be doped with the second conductivity type (e.g., the p-type). In exemplary embodiments of the present inventive concept, the impurity concentration of the second source expansion region 214 may be lower than the impurity concentration of the second source region 212.

The second drift region 220 may be formed in the base substrate 100 below the second drain region 222. Additionally, the second drift region 220 may be formed to surround the second drain region 222. The second drift region 220 may be doped with the second conductivity type (e.g., the p-type). Additionally, the impurity concentration of the second drift region 220 may be lower than the impurity concentration of the second source region 212 and the impurity concentration of the second drain region 222.

The second insulating structure 240 may be formed on the second drift region 220 between the second source region 212 and the second drain region 222. Additionally, the second insulating structure 240 may extend along the upper surface of the second drift region 220. In exemplary embodiments of the present inventive concept, the second insulating structure 240 may include a second buried insulating pattern 242 and a second semiconductor pattern 244 sequentially stacked on the second drift region 220.

The second gate structure 250 may be formed on the base substrate 100 between the second source region 212 and the second drain region 222. The second gate structure 250 may extend, for example, in a fourth direction Y2 intersecting the third direction X2. The second gate structure 250 may include a second gate electrode 252, a second gate dielectric film 254, and a second gate spacer 256.

A part of the second gate structure 250 adjacent to the second drain region 222 may overlap the second insulating structure 240. For example, the second gate dielectric film 254 may include a third portion 254a which extends along the upper surface of the second body region 210 between the second source region 212 and the second insulating structure 240, and a fourth portion 254b which extends from the third portion 254a and extends along the side surfaces and the upper surface of the second insulating structure 240.

A second dummy gate structure 260 may be formed on the second drift region 220 between the second insulating structure 240 and the second drain region 222. Additionally, the second dummy gate structure 260 may extend along the upper surface of the second drift region 220.

The second dummy gate structure 260 is illustrated as being spaced apart from the second insulating structure 240, but this is merely an example. For example, the second dummy gate structure 260 may be in contact with the second insulating structure 240.

The second dummy gate structure 260 may include a second dummy gate electrode 262, a second dummy gate dielectric film 264, and a second dummy gate spacer 266. The second dummy gate electrode 262 may extend, for example, in the fourth direction Y2. In exemplary embodiments of the present inventive concept, the second dummy gate electrode 262 may be electrically floating. The second dummy gate dielectric film 264 may be interposed between the base substrate 100 and the second dummy gate electrode 262. The second dummy gate spacer 266 may be formed on both side surfaces of the second dummy gate electrode 262.

In exemplary embodiments of the present inventive concept, silicide patterns 271, 272, 273, 274, and 275 may be formed on at least some parts of the exposed portions of the second body region 210, the second body contact region 216, the second source region 212, the second gate electrode 252, the second semiconductor pattern 244, the second dummy gate electrode 262, and the second drift region 220.

Figure 12:
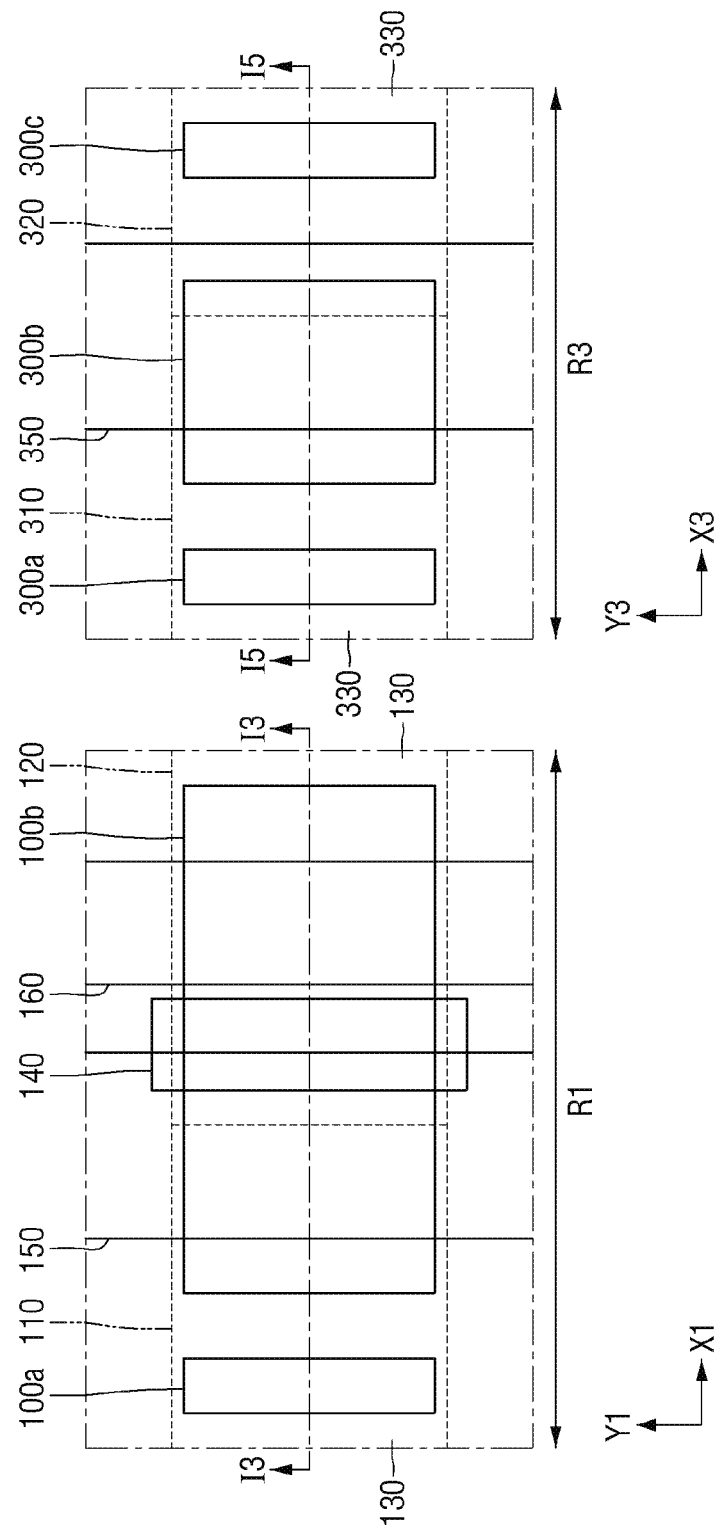
FIG. 12 is a schematic layout view for explaining a semiconductor device according to exemplary embodiments of the present inventive concept.
Figure 13:
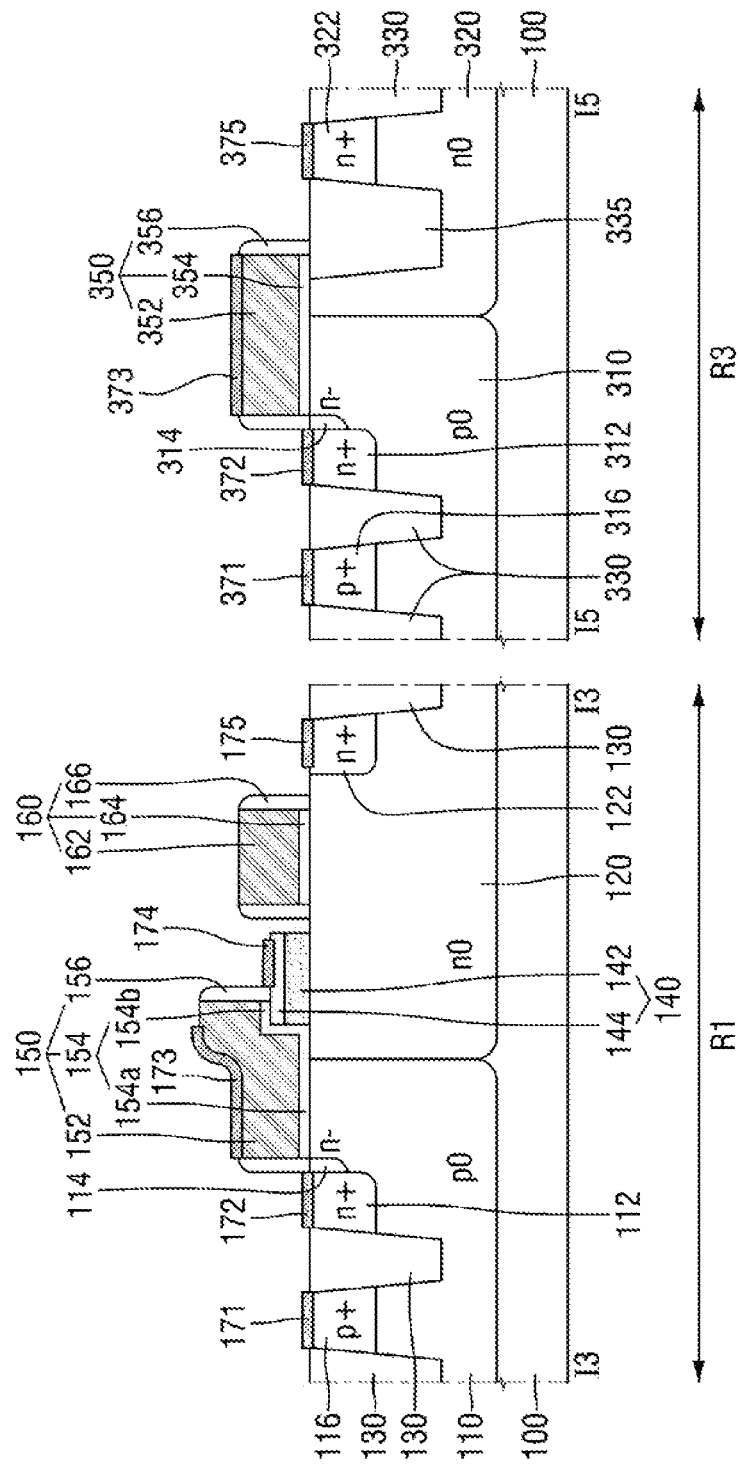
FIG. 13 is a cross-sectional view taken along lines I3-I3 and I5-I5 of FIG. 12 according to exemplary embodiments of the present inventive concept.

FIG. 12 is a schematic layout view for explaining a semiconductor device according to exemplary embodiments of the present inventive concept. FIG. 13 is a cross-sectional view taken along the lines I3-I3 and I5-I5 of FIG. 12. For the convenience of description, elements previously described using FIGS. 1 to 9 will be briefly described or descriptions thereof may be omitted.

Referring to FIGS. 12 and 13, the semiconductor device according to exemplary embodiments of the present inventive concept further includes a third element isolation region 330, a fourth element isolation region 335, a third body region 310, a third source region 312, a third drift region 320, a third drain region 322, and a third gate structure 350.

The base substrate 100 may include the first region R1 and a third region R3. The first region R1 and the third region R3 may be regions spaced apart from each other and may be regions connected to each other.

Hereinafter, it is assumed that n-type transistors are formed in both the first region R1 and the third region R3. However, p-type transistors may be formed in both the first region R1 and the third region R3, or transistors of different conductivity types may be formed in the first region R1 and the third region R3. For reference, since the elements formed in the first region R1 are substantially the same as the semiconductor device described using FIGS. 1 to 9, a detailed description thereof will not be provided below.

The third element isolation region 330, the fourth element isolation region 335, the third body region 310, the third source region 312, the third drift region 320, the third drain region 322, and the third gate structure 350 may be disposed on the third region R3 of the base substrate 100.

The base substrate 100 may further include a fifth active region 300a, a sixth active region 300b, and a seventh active region 300c disposed in the third region R3. The fifth active region 300a, the sixth active region 300b, and the seventh active region 300c may be isolated by the third element isolation region 330 and the fourth element isolation region 335 formed in the base substrate 100.

The third source region 312 and the third drain region 322 may be formed in the base substrate 100 to be spaced apart from each other. For example, the third source region 312 may be formed in the sixth active region 300b, and the third drain region 322 may be formed in the seventh active region 300c. Additionally, for example, the third source region 312 and the third drain region 322 may be formed to be spaced apart from each other in a fifth direction X3. The first direction X1 and the fifth direction X3 may be the same direction as each other or may be different directions from each other.

The third body region 310 may be formed in the base substrate 100 below the third source region 312. Additionally, the third body region 310 may be formed to surround the third source region 312.

In exemplary embodiments of the present inventive concept, a third body contact region 316 may be further formed in the third body region 310. The third body contact region 316 may be formed, for example, in the fifth active region 300a.

In exemplary embodiments of the present inventive concept, a third source expansion region 314 may be further formed in the third body region 310. The third source expansion region 314 may be formed, for example, in the sixth active region 300b.

The third drift region 320 may be formed in the base substrate 100 below the third drain region 322. Additionally, the third drift region 320 may be formed to surround the third drain region 322.

The fourth element isolation region 335 may be formed in the third drift region 320 between the third source region 312 and the third drain region 322. The fourth element isolation region 335 may be formed to isolate the third source region 312 and the third drain region 322.

The third gate structure 350 may be formed on the base substrate 100 between the third source region 312 and the third drain region 322. The third gate structure 350 may extend, for example, in a sixth direction Y3 intersecting the fifth direction X3. The third gate structure 350 may include a third gate electrode 352, a third gate dielectric film 354, and a third gate spacer 356.

A part of the third gate structure 350 adjacent to the third drain region 322 may overlap the fourth element isolation region 335. For example, one side of the third gate structure 350 adjacent to the third source region 312 may be disposed on the third body region 310, and the other side of the third gate structure 350 adjacent to the third drain region 322 may be disposed on the fourth element isolation region 335. In other words, the fourth element isolation region 335 may be interposed between the other side of the third gate structure 350 and the third drift region 320.

Accordingly, the fourth element isolation region 335 may prevent the breakdown voltage of the semiconductor device from being lowered due to the high electric field formed between the edge of the third gate electrode 352 and the third drain region 322.

In exemplary embodiments of the present inventive concept, silicide patterns 371, 372, 373, and 375 may be further formed on at least some parts of the exposed parts of the third body region 310, the third body contact region 316, the third source region 312, the third gate electrode 352, and the third drift region 320.

FIGS. 14 to 17 are intermediate stage diagrams for explaining a method for fabricating a semiconductor device according to exemplary embodiments of the present inventive concept. For the convenience of description, elements previously described with reference to FIGS. 1 to 13 will be briefly described or descriptions thereof may be omitted.

Figure 14:
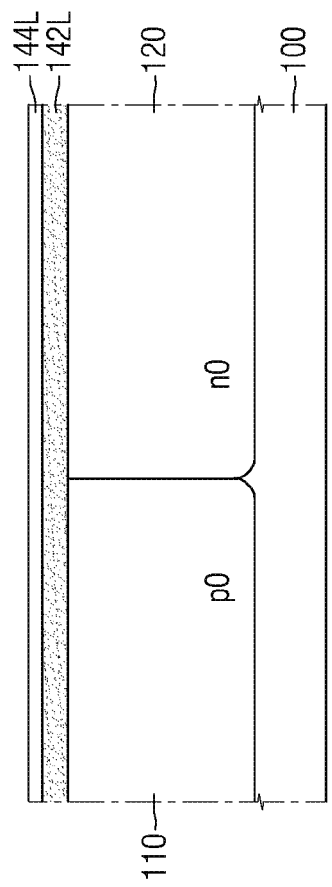
FIGS. 14 to 17 are intermediate stage diagrams for explaining a method for fabricating a semiconductor device according to exemplary embodiments of the present inventive concept.

Referring to FIG. 14, a substrate, in which the base substrate 100, a buried insulating film 142L, and a semiconductor film 144L are sequentially stacked, is provided.

The first body region 110 and the first drift region 120 may be formed in the base substrate 100.

The buried insulating film 142L may include, but is not limited to, for example, at least one of silicon oxide, silicon oxynitride, silicon nitride, or a combination thereof. For convenience of description, the buried insulating film 142L will be described as being silicon oxide as an example.

The semiconductor film 144L may include, for example, silicon (Si) or germanium (Ge) which is an elemental semiconductor material. Further, the semiconductor film 144L may also include a compound semiconductor, for example, a group IV-IV compound semiconductor or a group III-V compound semiconductor.

Formation of the base substrate 100, the buried insulating film 142L, and the semiconductor film 144L may include, for example, formation of a Silicon On Insulator (SOI) substrate.

Figure 15:
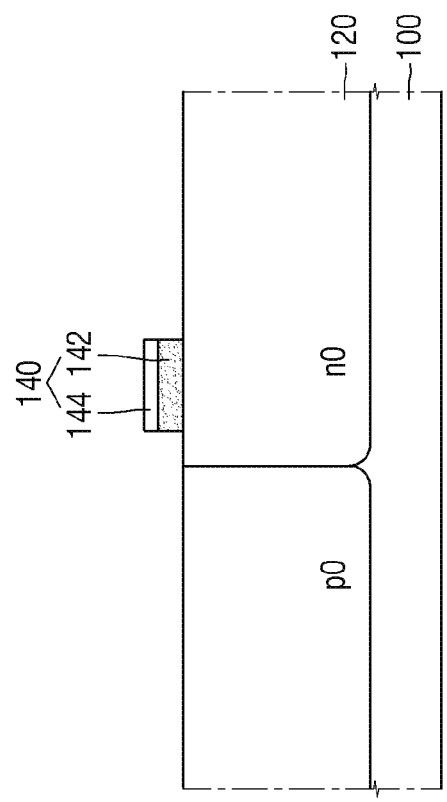

Referring to FIG. 15, the first insulating structure 140 is formed on the base substrate 100.

For example, by patterning the buried insulating film 142L and the semiconductor film 144L of FIG. 14, the first insulating structure 140 including the first buried insulating pattern 142 and the first semiconductor pattern 144 may be formed. The first insulating structure 140 may be formed on the first drift region 120.

Figure 16:
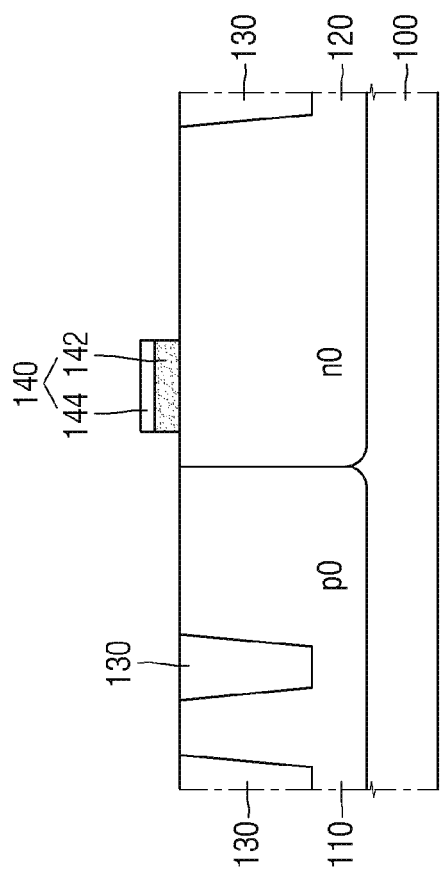

Referring to FIG. 16, the first element isolation region 130 is formed in the base substrate 100.

The first element isolation region 130 may be formed, but is not limited to, for example, by a STI process or a LOCOS process.

Figure 17:
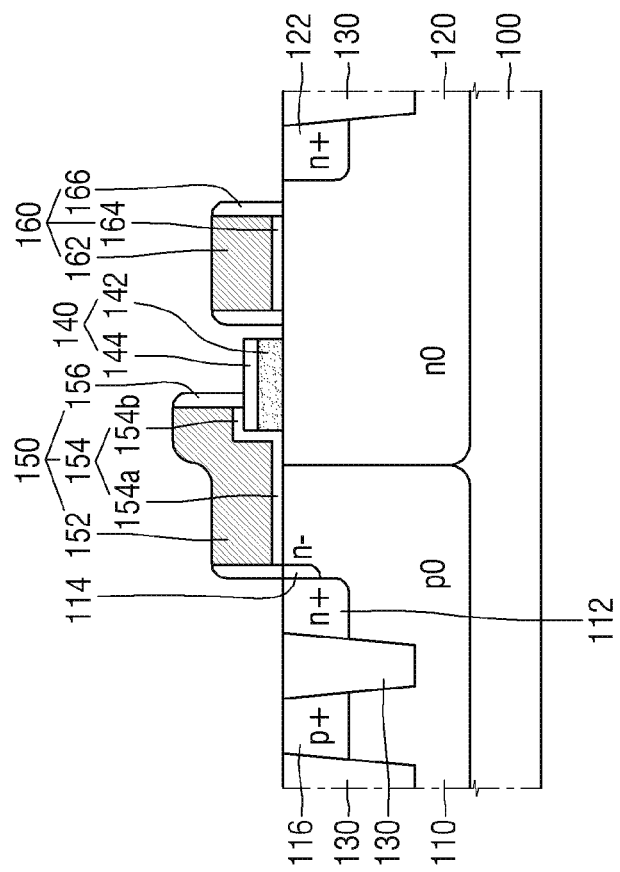

Referring to FIG. 17, the first gate structure 150, the first source region 112, and the first drain region 122 are formed.

For example, the first gate structure 150 may be formed on the base substrate 100. In exemplary embodiments of the present inventive concept, the first gate structure 150 may be formed over the first body region 110 and the first drift region 120. In addition, a part of the first gate structure 150 adjacent to the first drain region 122 may be formed to overlap the first insulating structure 140.

As described with reference to FIGS. 3 and 4, the first dummy gate structure 160 including the first dummy gate electrode 162, the first dummy gate dielectric film 164, and the first dummy gate spacer 166 may be formed at the same level (e.g., formed by the same fabricating process) as the first gate structure 150.

Subsequently, the first source region 112 may be formed in the first body region 110, and the first drain region 122 may be formed in the first drift region 120. In exemplary embodiments of the present inventive concept, the first body contact region 116 may be further formed in the first body region 110. In exemplary embodiments of the present inventive concept, the first source expansion region 114 may be further formed in the first body region 110.

The first source region 112, the first drain region 122, the first body contact region 116, and/or the first source expansion region 114 may be formed, for example, by an ion implantation process, but is not limited thereto.

Subsequently, as shown in FIG. 4, the body line B, the source line S, the gate line G, and the drain line D may be connected on the result of FIG. 17. Thus, the above-described semiconductor device may be manufactured as shown in FIG. 4.

Figure 18:
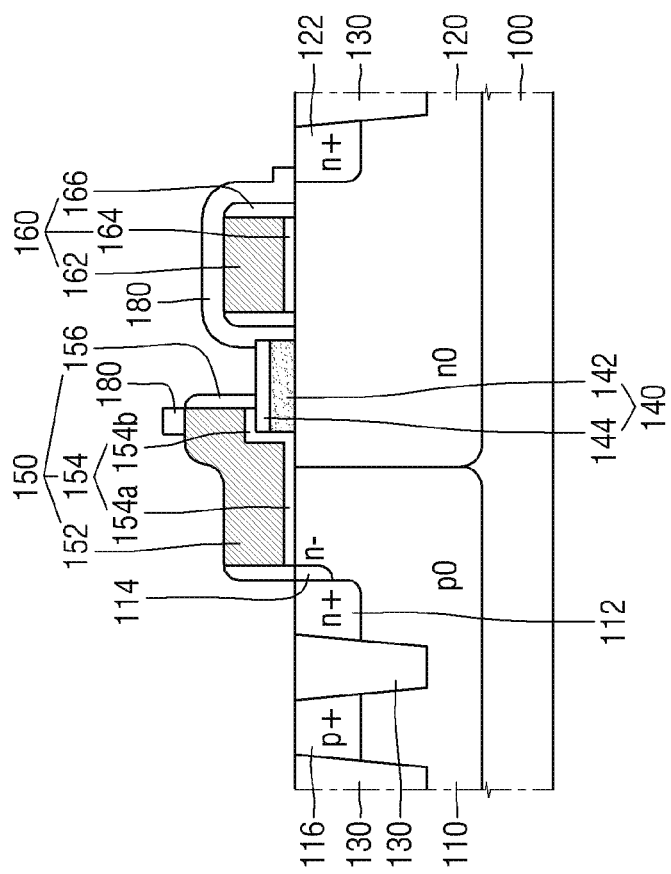
FIGS. 18 and 19 are intermediate stage diagrams for explaining a method for fabricating a semiconductor device according to exemplary embodiments of the present inventive concept.
Figure 19:
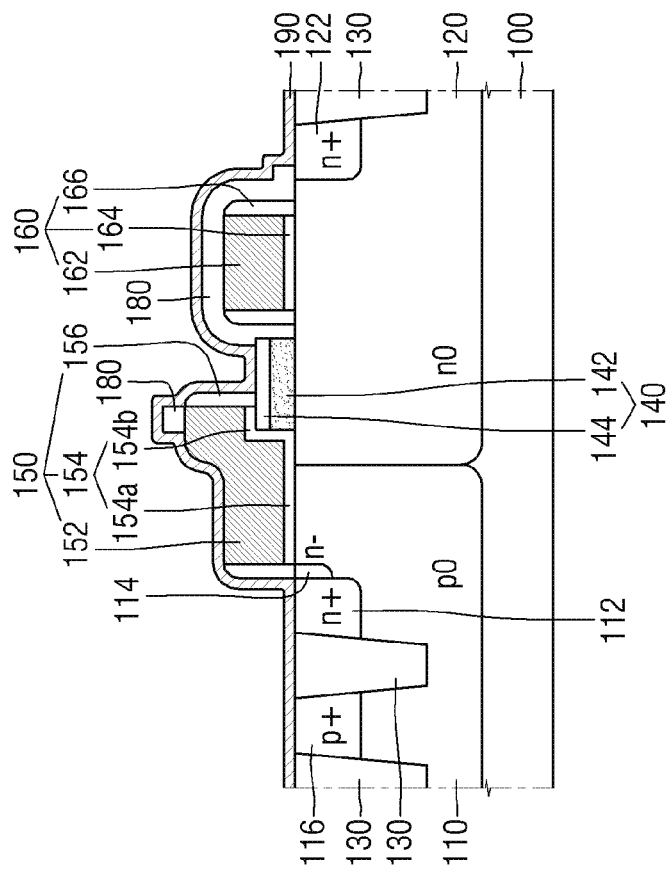

FIGS. 18 and 19 are intermediate stage diagrams for explaining a method for fabricating a semiconductor device according to exemplary embodiments of the present inventive concept. For the convenience of description, elements previously described using FIGS. 1 to 17 will be briefly described or descriptions thereof may be omitted. For reference, FIG. 18 is a diagram for explaining a procedure after FIG. 17.

Referring to FIG. 18, a blocking pattern 180 is formed on the result of FIG. 17.

The blocking pattern 180 may be formed on at least some parts of the first body region 110, the first body contact region 116, the first source region 112, the first gate electrode 152, the first semiconductor pattern 144, the first dummy gate electrode 162, and the first drift region 120.

For example, as illustrated, the blocking pattern 180 may completely cover the first dummy gate structure 160. Additionally, for example, the blocking pattern 180 may cover a part of the first semiconductor pattern 144 and a part of the first drain region 122.

In exemplary embodiments of the present inventive concept, the blocking pattern 180 may cover at least a part of the first gate electrode 152 that overlaps the first drift region 120.

Referring to FIG. 19, a metal film 190 is formed on the result of FIG. 18.

The metal film 190 may be formed on the blocking pattern 180. The metal film 190 may be in contact with regions not covered with the blocking pattern 180, among the first body region 110, the first body contact region 116, the first source region 112, the first gate electrode 152, the first semiconductor pattern 144, the first dummy gate electrode 162, and the first drift region 120.

The metal film 190 may include, but is not limited to, for example, at least one of titanium (Ti), tantalum (Ta), tungsten (W), nickel (Ni), cobalt (Co), or combinations thereof.

Subsequently, as shown in FIG. 8, silicide patterns 171, 172, 173, 174, and 175 may be formed.

For example, an annealing process on the result of FIG. 19 may be performed. By the annealing process, portions in contact with the metal film 190, among the first body region 110, the first body contact region 116, the first source region 112, the first gate electrode 152, the first semiconductor pattern 144, the first dummy gate electrode 162, and the first drift region 120, may react with the metal film 190 to form the silicide patterns 171, 172, 173, 174, and 175. Unreacted metal film 190 may be removed.

Therefore, in exemplary embodiments of the present inventive concept, the third silicide pattern 173 which exposes at least a part of the first gate electrode 152 overlapping the first drift region 120 may be formed.

While the present inventive concept has been shown and described with reference to exemplary embodiments thereof, it will be apparent to those of ordinary skill in the art that various modifications in form and details may be made thereto without departing from the spirit and scope of the present inventive concept as set forth by the appended claims.

What is claimed is:

1. A semiconductor device comprising:
an active region defined by an element isolation region in a base substrate;
a source region and a drain region of a first conductivity type spaced apart from each other, and formed in the active region;
a body region of a second conductivity type surrounding the source region, and formed in the base substrate;
a drift region of the first conductivity type surrounding the drain region, having a lower impurity concentration than the drain region, and formed in the base substrate;
an insulating structure including a buried insulating pattern and a semiconductor pattern sequentially stacked on the drift region;
a gate dielectric film including a first portion extending along an upper surface of the body region and a second portion extending along a side surface and an upper surface of the insulating structure; and
a gate electrode extending, along an upper surface of the gate dielectric film,
wherein the gate dielectric film does not extend beyond an edge of the gate electrode that is adjacent to the drain region.

2. The semiconductor device of claim 1, wherein the element isolation region is not disposed in the drift region between the source region and the drain region.

3. The semiconductor device of claim 1, further comprising:
a dummy gate dielectric film extending along an upper surface of the drift region, and formed on the drift region between the insulating structure and the drain region; and
a dummy gate electrode extending along an upper surface of the dummy gate dielectric film.

4. The semiconductor device of claim 3, wherein the gate electrode and the dummy gate electrode are formed at the same level, and
the gate dielectric film and the dummy gate dielectric film are formed at the same level.

5. The semiconductor device of claim 1, further comprising:
a silicide pattern extending along an upper surface of the gate electrode.

6. The semiconductor device of claim 5, wherein the suicide pattern exposes at least a pan of the gate electrode overlapping, the drift region.

7. The semiconductor device of claim 1, further comprising:
a field plate configured to apply a predetermined voltage to the semiconductor pattern.

8. The semiconductor device of claim 7, wherein the predetermined voltage is a ground voltage.

9. The semiconductor device of claim 7, further comprising:
a silicide pattern extending along at least a part of the upper surface of the semiconductor pattern,
wherein the field plate is connected to the silicide pattern.

10. The semiconductor device of claim 1, wherein the first portion of the gate dielectric film extends along an upper surface of the body region and an upper surface of the drift region, between the source region and the insulating structure.

11. The semiconductor device of claim 1, further comprising:
- a body contact region of the second conductivity type having an impurity concentration higher than the body region, and formed in the body region.

12. A semiconductor device comprising:
- a base substrate;
- a gate structure formed on the base substrate, and including a gate electrode and a gate dielectric film between the base substrate and the gate electrode;
- a source region of a first conductivity type disposed on a first side of the gate structure;
- a body region of a second conductivity type surrounding the source region, and formed in the base substrate;
- a drain region of the first conductivity type disposed on a second side of the gate structure;
- a drift region of the first conductivity type surrounding the drain region; having an impurity concentration lower than the drain region, and formed in the base substrate;
- a dummy gate structure formed on the drift region, and including a dummy gate electrode and a dummy gate dielectric film between the drift region and the dummy gate electrode; and
- an insulating structure interposed between the second side of the gate structure and the drift region,
- wherein a lowermost surface of the insulating structure is disposed on the same plane as an uppermost surface of the drift region,
- wherein the insulating structure is interposed between the drift region and a first side of the dummy gate structure adjacent to the source region.

13. The semiconductor device of claim 12, wherein the insulating structure includes a buried insulating pattern and a semiconductor pattern sequentially stacked on the drift region.

14. The semiconductor device of claim 12, wherein a height of the gate structure overlapping the body region is substantially the same as a height of the dummy gate structure overlapping the drift region.

15. A semiconductor device comprising:
- a base substrate;
- a source region and a drain region of a first conductivity type spaced apart from each other, and formed in the base substrate;
- a body region of a second conductivity type surrounding the source region, and formed the base substrate;
- a drift region of the first conductivity type surrounding the drain region, having a lower impurity concentration than the drain region, and formed in the base substrate;
- an insulating structure disposed on the drill region;
- a gate structure disposed over the body region and the insulating structure, and formed on the base substrate between the source region and the drain region; and
- a dummy gate structure extending along an upper surface of the drift region, and formed on the drift region between the insulating structure and the drain region,
- wherein the insulating structure is disposed between the dummy gate structure and the upper surface of the drift region.

16. The semiconductor device of claim 15, wherein the dummy gate structure is electrically floating.

17. The semiconductor device of claim 15, wherein a predetermined voltage is applied to the dummy gate structure.

18. The semiconductor device of claim 15, further comprising:
- a silicide pattern which extends along an upper surface of the gate structure a exposes at least a part of the gate structure overlapping the drift region; and
- a field plate configured to apply a predetermined voltage to the insulating structure.

* * * * *